(12) United States Patent
Ko

(10) Patent No.: US 7,646,051 B2
(45) Date of Patent: Jan. 12, 2010

(54) SEMICONDUCTOR DEVICES HAVING A BIT LINE PLUG AND METHODS OF FABRICATING THE SAME

(75) Inventor: Sung-Hoon Ko, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 11/702,616

(22) Filed: Feb. 6, 2007

(65) Prior Publication Data
US 2007/0181926 A1 Aug. 9, 2007

(30) Foreign Application Priority Data
Feb. 7, 2006 (KR) .................. 10-2006-0011855

(51) Int. Cl.
*H01L 27/108* (2006.01)
(52) U.S. Cl. ............... 257/296; 257/382; 257/311; 257/774
(58) Field of Classification Search .......... 257/774, 257/296, 309, 311, 382–385
See application file for complete search history.

(56) References Cited

U.S. PATENT DOCUMENTS

| | | | |
|---|---|---|---|
| 6,417,097 B1 | 7/2002 | Hwang et al. | |
| 6,489,197 B2 | 12/2002 | Uchiyama | |
| 6,690,093 B2 * | 2/2004 | Ahn et al. | 257/774 |

FOREIGN PATENT DOCUMENTS

| | | |
|---|---|---|
| JP | 2001-257325 | 9/2001 |
| KR | 10-2000-0043055 A | 7/2000 |
| KR | 10-2001-0089214 | 9/2001 |
| KR | 10-2002-0017041 | 3/2002 |
| KR | 10-2003-0058635 | 7/2003 |
| KR | 10-2004-0017982 | 3/2004 |
| KR | 10-2004-0057562 A | 7/2004 |
| KR | 10-2004-0057584 A | 7/2004 |

* cited by examiner

*Primary Examiner*—Matthew C Landau
*Assistant Examiner*—Candice Y Chan
(74) *Attorney, Agent, or Firm*—Lee & Morse, P.C.

(57) ABSTRACT

A semiconductor device includes a semiconductor substrate, a storage pad and a bit line pad on the semiconductor substrate, a first interlayer insulating layer covering the bit line pad and including a bit line contact hole having a width greater than a width of the bit line pad, a barrier insulating layer on sidewalls of the first interlayer insulating layer and upper portions of sidewalls of the bit line pad that are exposed by the bit line contact hole, a bit line plug in the bit line contact hole and on the barrier insulating layer; and a storage plug penetrating the first interlayer insulating layer and contacting the storage pad.

17 Claims, 7 Drawing Sheets

SEMICONDUCTOR DEVICES HAVING A BIT LINE PLUG AND METHODS OF FABRICATING THE SAME

BACKGROUND OF THE INVENTION

1. Field of the Invention

The present invention relates to semiconductor devices and methods of fabricating the same. More particularly, the invention relates to semiconductor devices having a bit line plug and methods of fabricating the same.

2. Description of the Related Art

As semiconductor devices are becoming more highly integrated, cell sizes of memory cells are rapidly decreasing. In particular, the high degree of integration in dynamic random access memories (DRAMs) has caused an interval between gate electrodes to be a minimum feature size according to the design rule. Also, as semiconductor devices are becoming more highly integrated, intervals between a contact hole connecting a lower wiring layer with an upper wiring layer and wirings around the contact hole are decreasing. Therefore, when a storage contact hole is formed using a photolithography process in a highly integrated semiconductor device employing a multilayer wiring structure, there are limits to performing a desired process. Accordingly, self-aligned contact (SAC) technology for forming a contact hole using a lower pattern as an etch stop layer is being developed to overcome limitations of the photolithography process. SAC technology may be applied to a storage plug forming process using a bit line pattern as an etch stop layer as well as to a bit line and storage pad forming process using gate patterns as an etch stop layer.

When employing SAC technology, in order to increase a contact area between storage pads and storage plugs of a memory cell, contact holes may be formed to extend below sidewall insulation spacers adjacent to a bit line. Although sidewalls of a bit line plug may be covered with a barrier metal layer, a barrier insulation layer and/or an interlayer insulating layer, during etching, etching solution used to etch the interlayer insulating layer between adjacent bit lines may permeate into an upper portion, e.g., upper edge, of a bit line pad below the bit line plug. For example, in conventional structures, when first and second interlayer insulating layers are isotropically etched, an etching solution may permeate into a bit line pad, thereby modifying a silicide layer that is an ohmic layer. Improved structures and/or methods of fabricating semiconductor devices including bit line plugs are desired.

SUMMARY OF THE INVENTION

The present invention is therefore directed to semiconductor devices including a bit line plug and methods of manufacturing such devices, which substantially overcome one or more of the problems due to the limitations and disadvantages of the related art.

It is therefore a feature of embodiments of the invention to provide methods of manufacturing semiconductor devices capable of preventing an etching solution from permeating into a bit line pad while forming a storage contact hole.

It is therefore a separate feature of embodiments of the invention to provide semiconductor devices having relatively low contact resistance between a bit line pad and a bit line plug.

It is therefore a separate feature of embodiments of the invention to provide semiconductor devices having a structure that protects a bit line pad from damage that may occur while forming a storage contact hole.

At least one of the above and other features and advantages of the present invention may be realized by providing a semiconductor device, including a semiconductor substrate, a storage pad and a bit line pad on the semiconductor substrate, a first interlayer insulating layer covering the bit line pad and including a bit line contact hole having a width greater than a width of the bit line pad, a barrier insulating layer on sidewalls of the first interlayer insulating layer and upper portions of sidewalls of the bit line pad that are exposed by the bit line contact hole, a bit line plug in the bit line contact hole and on the barrier insulating layer, and a storage plug penetrating the first interlayer insulating layer and contacting the storage pad.

The barrier insulating layer may continuously extend on the sidewalls of the first interlayer insulating layer and the upper portions of sidewalls of the bit line pad. The semiconductor device may include a barrier metal layer continuously interposed between the bit line plug and the barrier insulating layer, and the bit line plug and the bit line pad.

The semiconductor device may include a bit line on the first interlayer insulating layer, the bit line being connected with the bit line plug, a sidewall insulating layer formed on sidewalls of the bit line, and a second interlayer insulating layer between the bit line plug and the sidewall insulating layers and having a storage contact hole filled with the storage plug, wherein a boundary of the storage contact hole may be at least partially defined by the sidewall insulating layers and the barrier insulating layer.

The first interlayer insulating layer may have an etching rate higher than that of the second interlayer insulating layer, and the barrier insulating layer may include a material having an etch selectivity with respect to the first interlayer insulating layer. The bit line contact hole may extend below at least a portion of the sidewall insulating spacers. The barrier insulating layer may include a material having an etch selectivity with respect to the first interlayer insulating layer. The barrier insulating layer may be continuously interposed between the storage plug and the bit line plug, and may thereby prevent contact between the storage plug and the bit line plug.

The semiconductor device may further include an active region defined in the semiconductor substrate, a plurality of word lines overlapping the active region, spacer patterns formed on sidewalls of the word lines, and a capping insulating layer formed on each of the word lines, wherein the storage pad and the bit line pad may be self-aligned with the spacer patterns and are on the active region.

The first interlayer insulating layer may define a boundary of the bit line contact hole on the capping insulating layer, and the barrier insulating layer may be continuously formed in the bit line contact hole on sidewalls of the first interlayer insulating layer, an upper surface of the capping insulating layer, and upper portions of sidewalls of the bit line pad. The semiconductor device may further include a barrier metal layer continuously interposed between the bit line plug and the barrier insulating layer, and the bit line plug and the bit line pad. The semiconductor device may further include a bit line connected with the bit line plug and extending in a direction on the first interlayer insulating layer, sidewall insulating layers formed on sidewalls of the bit line, and a second interlayer insulating layer filled between the bit line plug and the sidewall insulating layers and having a storage contact hole filled with the storage plug, wherein a boundary of the storage contact hole may be defined by the sidewall insulating layers and the barrier insulating layer.

The first interlayer insulating layer may have an etching rate higher than that of the second interlayer insulating layer, and the barrier insulating layer may include a material having an etch selectivity with respect to the first interlayer insulating layer. The barrier insulating layer may be continuously interposed between the storage plug and the bit line plug, and may thereby prevent contact between the storage plug and the bit line plug.

At least one of the above and other features and advantages of the present invention may be separately realized by providing a method of fabricating a semiconductor device, including forming a storage pad and a bit line pad on a semiconductor substrate, forming a first interlayer insulating layer covering the storage pad and the bit line pad, etching a portion of the first interlayer insulating layer on the bit line pad to form a bit line contact hole having a width greater than a width of the bit line pad and exposing an upper surface and upper portions of sidewalls of the bit line pad, forming a barrier insulating layer covering sidewalls of the first interlayer insulating layer and the upper portions of the sidewalls of the bit line pad that are exposed in the bit line contact hole, forming a bit line plug filling the bit line contact hole in which the barrier insulating layer is formed, and forming a storage plug penetrating the first interlayer insulating layer and contacting the storage pad.

The method may further include, before the forming of the bit line plug, forming a conformal barrier metal layer on the bit line plug and the barrier insulating layer exposed in the bit line contact hole. The barrier insulating layer may be formed to include a material having an etch selectivity with respect to the first interlayer insulating layer.

The method may further include forming a bit line on the first interlayer insulating layer, the bit line may be connected with the bit line plug, forming sidewall insulating layers on sidewalls of the bit line, and forming a second interlayer insulating layer covering the bit line plug and the first interlayer insulating layer, wherein the storage plug may be formed to penetrate the second and first interlayer insulating layers.

The first interlayer insulating layer may be formed to include a material having an etching rate higher than that of the second interlayer insulating layer, and the barrier insulating layer may be formed to include a material having an etch selectivity with respect to the first interlayer insulating layer. Forming the storage plug may include anisotropically etching the second and first interlayer insulating layers using the sidewall insulating layers and the barrier insulating layer as an etch stop layer to form a storage contact hole exposing the storage pad, and filling the storage contact hole with a conductive layer to form the storage plug.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
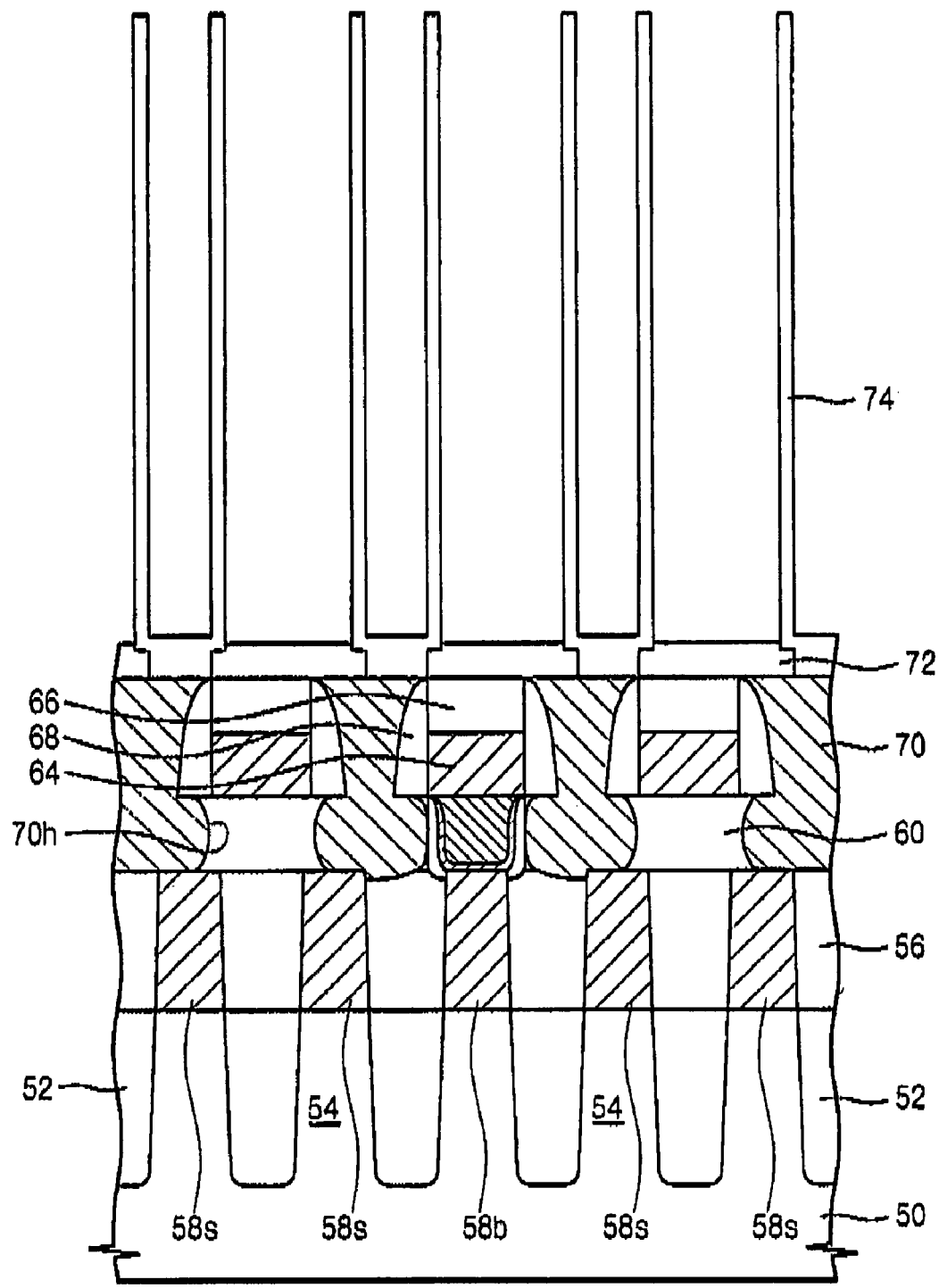
FIGS. 1A and 1B illustrate cross-sectional views, along a word line direction and a bit line direction, respectively, of an exemplary DRAM cell according to an exemplary embodiment of the present invention.

Korean Patent Application No. 10-2006-11855, filed on Feb. 7, 2006, in the Korean Intellectual Property Office, and entitled: "Semiconductor Device and Method of Fabricating the Same," is incorporated by reference herein in its entirety.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions may be exaggerated for clarity of illustration. It will also be understood that when a layer or element is referred to as being 'on' another layer, substrate or element, it can be directly on the other layer, substrate or element, or intervening layers may also be present. Further, it will be understood that when a layer or element is referred to as being "under" another layer or element, it can be directly under or one or more intervening layers or elements may also be present. In addition, it will also be understood that when a layer or element is referred to as being "between" two layers, it can be the only element or layer between the two layers or elements, or one or more intervening layers and/or elements may also be present. Like reference numerals refer to like elements throughout the specification.

Figure 1B:
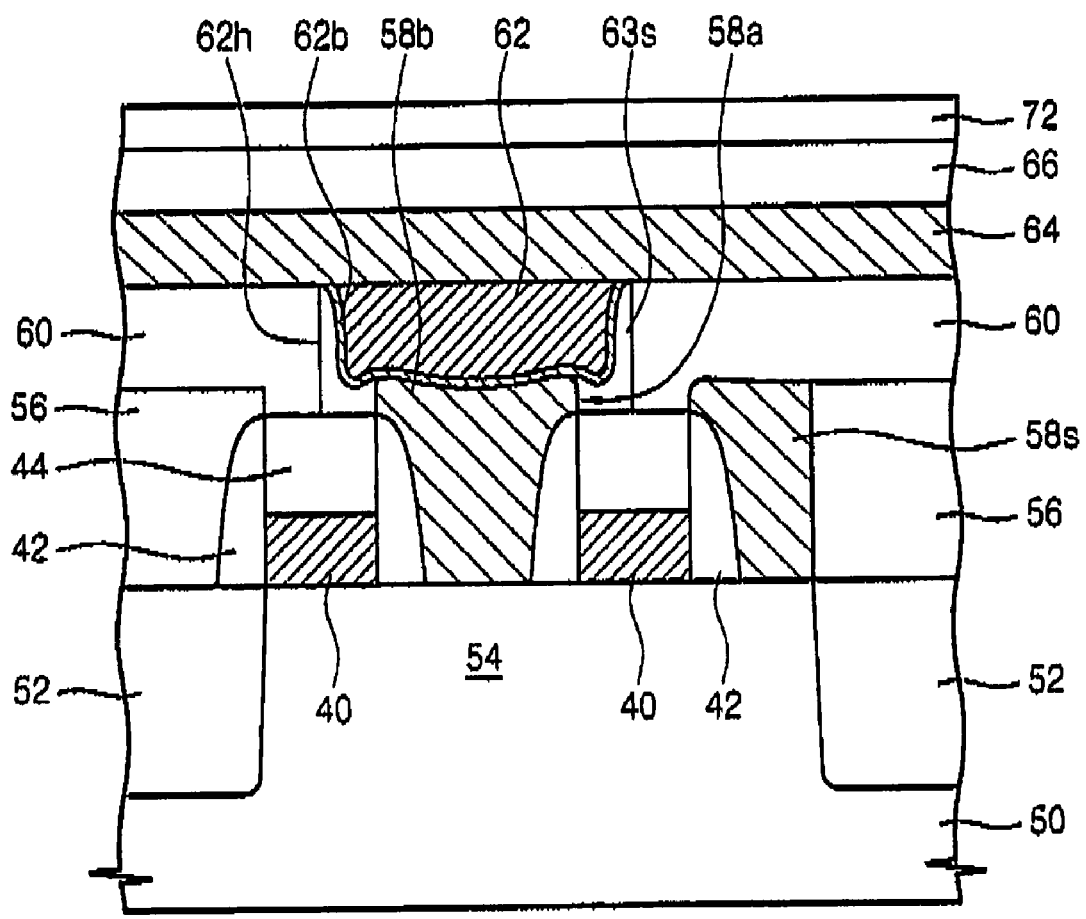

FIGS. 1A and 1B illustrate cross-sectional views, along a word line direction and a bit line direction, respectively, of an exemplary DRAM cell according to an exemplary embodiment of the present invention.

Referring to FIGS. 1A and 1B, one or more aspects of the present invention may be employed by a DRAM cell including a capacitor that may be electrically connected with a storage pad. However, embodiments of the invention are not limited thereto. For example, one or more aspects of the invention may be employed by a semiconductor device having a bit line and a storage plug, e.g., a phase change memory including a phase change resistor connected with a storage pad, a magnetic random access memory (MRAM) including a magnetic tunneling junction (MTJ) connected with a storage pad, etc.

Referring to FIGS. 1A and 1B, a DRAM cell employing one or more aspects of the present invention may include device isolating layers 52, a plurality of word lines 40, a lower interlayer insulating layer 56, a bit line pad 58b and storage pads 58s. The device isolating layers 52 may be formed in a semiconductor substrate 50 and may define active region(s) 54. The lower interlayer insulating layer 56 may be formed on a surface, e.g., an entire surface of the semiconductor substrate 50 where the word lines 40 are formed. The plurality of word lines 40 may intersect the active region 54. The bit line pad 58b may be formed between adjacent word lines 40 on the active region 54 and may penetrate the lower interlayer insulating layer 56. The storage pads 58s may be formed, on the active region 54 on both sides of the bit line pad 58b and may penetrate the lower interlayer insulating layer 56.

A pair of the word lines 40 may intersect the active region 54, and may divide the active region 54 into three regions. As a cell array may be highly integrated, a cell array structure may include word lines that intersect an active region at an angle, e.g., not straight across or perpendicularly. Therefore, as illustrated in FIG. 1B, three active regions may not be shown in both sides of the pair of word lines depending on a section.

The bit line pad 58b may be formed between a pair of the word lines 40 on the active region 54, and the storage pads 58s may be formed on the active region 54 on both sides where the bit line pad 58b is formed. Sidewalls and an upper surface of each of the word lines 40 may be covered with spacer insulating patterns 42 and a capping insulating layer 44 respectively. The bit line pad 58b and the storage pads 58s may penetrate the lower interlayer insulating layer 56 and may be self-aligned with the capping insulating layer 44 and the spacer insulating patterns 42.

A first interlayer insulating layer 60 may be formed on the lower interlayer insulating layer 56 where the bit line pad 58b and the storage pads 58s are formed. The first interlayer insulating layer 60 on the bit line pad 58b may be etched to form a bit line contact hole 62h. A width of the bit line contact hole 62h may be greater than that of the bit line pad 58b. Therefore, the bit line contact hole 62h may overlap the capping insulating layer 44 and the lower interlayer insulating layer 56 around the bit line pad 58b. A barrier insulating layer 63s may be continuously formed on sidewalls of the first interlayer insulating layer 60 and upper portions 58a of the sidewalls of the bit line pad 58b. In some embodiments of the invention, the barrier insulating layer 63s may be continuously formed along respective sidewall portions of the first interlayer insulating layer 60 and the bit line pad 58b.

A barrier metal layer 62b may be conformally formed on the barrier insulating layer 63s and the bit line pad 59b. A bit line plug 62 may fill the bit line contact hole 62h. The bit line plug 62 may be formed of a conductive material and may be disposed on the barrier metal layer 62b within the bit line contact hole 63s. A bit line 64 may be disposed on and may be connected to the bit line plug 62. The bit line 64 may extend in a direction crossing and/or overlapping the word lines 40 on the first interlayer insulating layer 60.

Sidewall insulating layers 68 may be formed on both sidewalls of the bit line 64 and a capping layer 66 may be formed on the bit line 64. A second interlayer insulating layer (not shown) may be formed over the semiconductor substrate 50, e.g., on the first interlayer insulating layer 60 where the bit line 64 is formed. The first interlayer insulating layers 60 and the second interlayer insulating layer on the storage pad 58s may be removed to form storage contact holes 70h.

Storage plugs 70 may be formed of a conductive material filling the storage contact holes 70h. The storage contact holes 70h may laterally extend under the sidewall insulating layers 68, and a boundary of the storage contact holes 70h may be confined by the barrier insulating layer 63s. The storage plugs 70 may be connected with the storage pads 58s. The sidewall insulating layers 68 and the capping layer 66 may be formed of a material having an etch selectivity with respect to the first insulating layer 60 and the second interlayer insulating layer. Therefore, the storage contact holes 70h may be self-aligned with the capping layer 66 and the sidewall insulating layers 68. During etching of the first interlayer insulating layer 60 and second interlayer insulating layer, the sidewall insulating layer 68, the capping layer 66, and the barrier insulating layer 63s may function as an etch stop layer. The storage contact holes 70h may expose at least a portion of the storage pads 58s.

In embodiments of the invention, because the bit line contact hole 62h may be wider than the bit line pad 58b, the barrier insulating layer 63s may overlap, e.g., surround, upper portions 58a of sidewalls of the bit line pad 58b as well as the bit line plug 62 and the barrier metal layer 62b. Therefore, in embodiments of the invention, because a boundary of the storage contact holes 70h may be confined by the barrier insulating layer 63s, permeation of an etching solution, e.g., an etching solution used to form the storage contact holes 70h, may be reduced and/or prevented. Embodiments of the invention enable a short circuit between the bit line pad 58b and the storage contact holes 70h to be reduced and/or prevented.

Referring to FIG. 1B, when the present invention is applied to a general DRAM cell, an upper interlayer insulating layer 72 may be formed on the semiconductor substrate 50. More particularly, e.g., the upper insulating layer 72 may be formed on an entire surface of the semiconductor substrate 50 where the storage plugs 70 are formed. Storage electrodes 74 may be formed to penetrate the upper interlayer insulating layer 72 and may thereby contact the storage plugs 70. In some embodiments of the invention, e.g., instead of the storage electrodes 74, a phase transformation resistor may be formed in a phase transformation memory and an MTJ may be formed in a MRAM. In some embodiments of the invention, the storage electrodes 74 may be cylindrical. However, embodiments of the invention are not limited to cylindrical storage electrodes 74. For example, in some embodiments, the storage electrodes 74 may be flat.

FIGS. 2A, 3A, 4A, 5A and 6A illustrate cross-sectional views, taken along a first direction, of stages in a method of fabricating a semiconductor device according to an exemplary embodiment of the present invention, taken along a first direction. FIGS. 2B, 3B, 4B, 5B and 6B illustrate cross-sectional views, taken along a second direction, of the stages illustrated in FIGS. 2A through 6A.

Figure 2A:
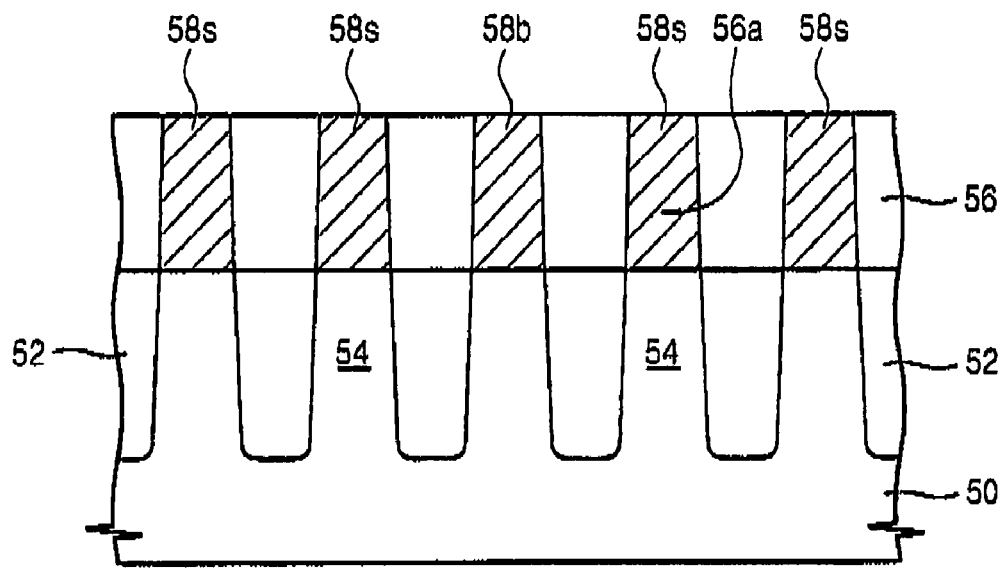
FIGS. 2A, 3A, 4A, 5A and 6A illustrate cross-sectional views, taken along a first direction, of stages in a method of fabricating a semiconductor device according to an exemplary embodiment of the present invention, taken along a first direction.
Figure 2B:
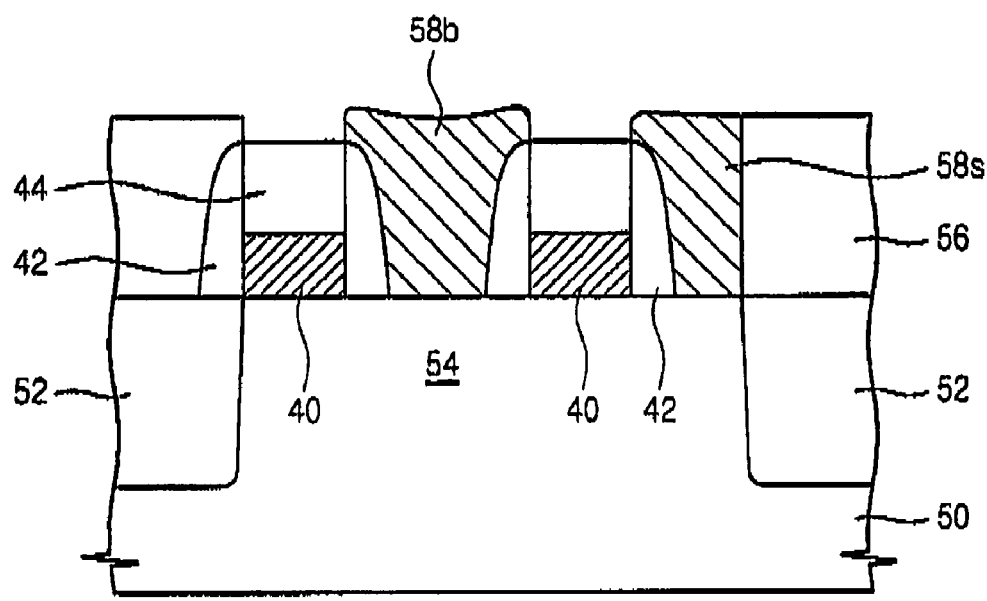
FIGS. 2B, 3B, 4B, 5B and 6B illustrate cross-sectional views, taken along a second direction, of the stages illustrated in FIGS. 2A, 3A, 4A, 5A and 6A.

Referring to FIGS. 2A and 2B, the device isolating layers 52 may be formed in the semiconductor substrate 50 to define active region(s) 54. The word lines 40 may be formed to overlap the device isolating layers 52 and/or the active region 54. The capping insulating layer 44 may be formed on each of the word lines 40, and the spacer insulating patterns 42 may be formed on sidewalls of each of the word lines 40. The lower interlayer insulating layer 56 may be formed on the semiconductor substrate 50, e.g., on an entire surface of the semiconductor substrate 50 where the word lines 40 are formed. Pad openings 56a may be formed to penetrate the lower interlayer insulating layer 56, thereby exposing a portion of the active region on both sides of the word lines 40. The lower interlayer insulating layer 56 may be formed of a material having an etch selectivity with respect to the capping insulating layer 44 and the spacer patterns 42. For example, the capping insulating layer 44 and the spacer patterns 42 may be formed of a silicon nitride layer and the lower interlayer insulating layer 56 may be formed of a silicon oxide layer.

When the capping insulating layer 44 and the spacer patterns 42 are formed of a silicon oxide layer, or the capping insulating layer and/or the spacer patterns 42 are not formed, an etch stop layer having an etch selectivity with respect to the lower interlayer insulating layer 56 may be conformally formed on a surface, e.g., an entire surface, of the substrate before forming of the lower interlayer insulating layer 56. Therefore, the pad openings 58c may be self-aligned with the capping insulating layer 44 and the spacer patterns 42. The bit line pad 58b may be formed between a pair of the word lines on the active region 54 and may fill the pad opening 58c. The storage pads 58s may be formed on the exposed portions of the active region 54 on both sides of the bit line pad 58b. The bit line pad 58b and the storage pads 58s may be formed by forming a conductive layer (not shown) and then dividing the conductive layer by planarization or patterning, or by growing an epitaxial layer on a surface of a semiconductor substrate 50 corresponding to the active region 54.

In embodiments of the invention including forming and planarizing a conductive layer, the conductive layer may be planarized using the capping insulating layer 44 as a stop layer. Therefore, an upper surface of the bit line pad 58b and the storage pads 58s may be as high as an upper surface of the capping insulating layer 44.

Figure 3A:
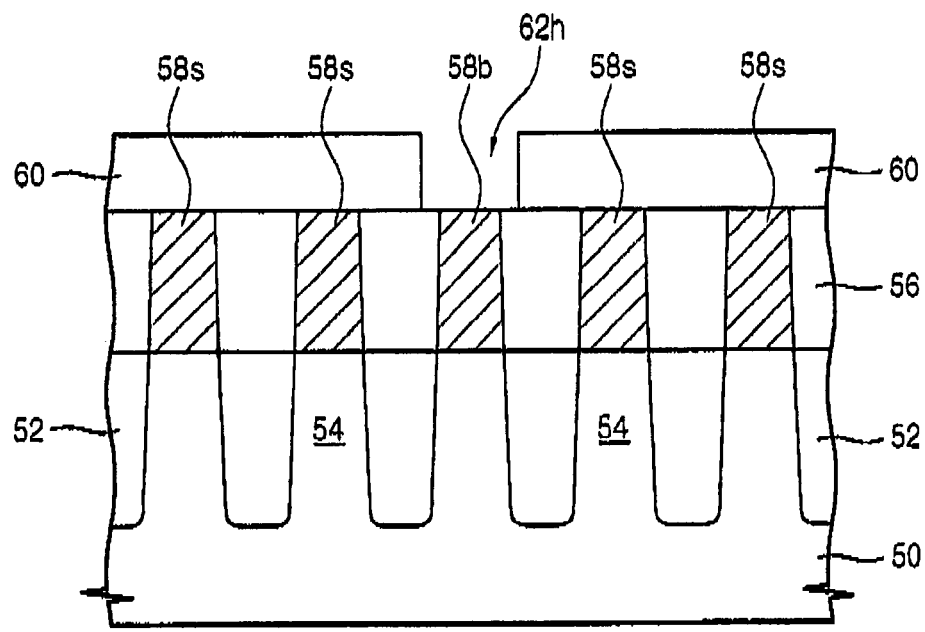
Figure 3B:
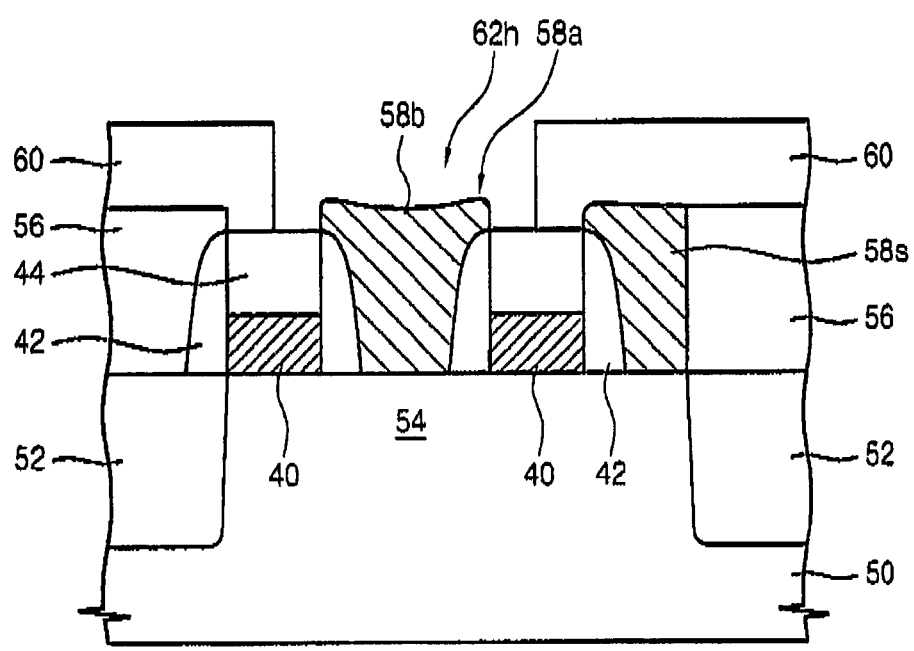

Referring to FIGS. 3A and 3B, the first interlayer insulating layer 60 may be formed on a surface of the semiconductor substrate 50. More particularly, e.g., the first interlayer insulating layer 60 may be formed on an entire surface of the semiconductor substrate 50 where the bit line pad 58b and the storage pads 58s are formed. A portion of the first interlayer insulating layer 60 on the bit line pad 58b may be removed to form the bit line contact hole 62h exposing the bit line pad 58b. At this stage, because a width of the bit line contact hole 62h may be greater than a width of the bit line pad 58b, the lower interlayer insulating layer 56 and the capping insulating layers 44 around the bit line pad 58b may be partially exposed. As shown in FIG. 3B, portions of the lower interlayer insulating layer 56 may be etched and recessed when the bit line contact hole 62h is formed. Therefore, upper portions 58a of sidewalls of the bit line pad 58b and/or an upper surface of the bit line pad 58b may be exposed in the bit line contact hole 62h.

Figure 4A:
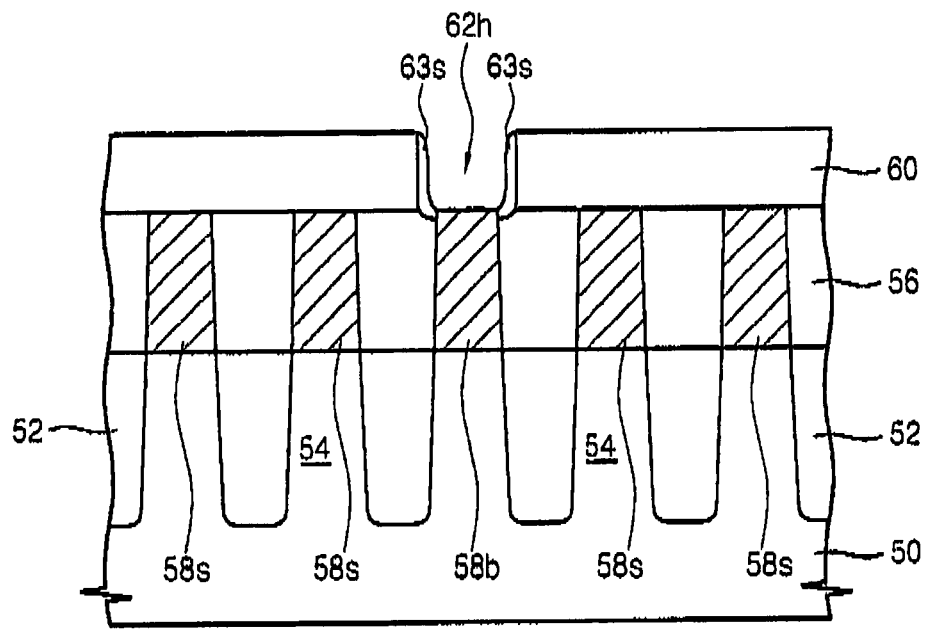
Figure 4B:
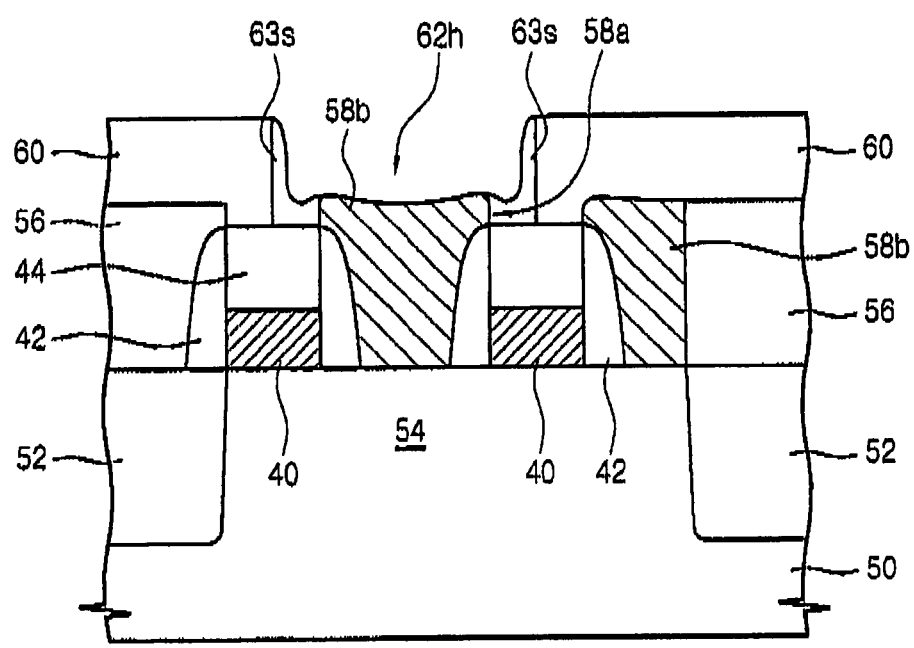

Referring to FIGS. 4A and 4B, an insulating layer (not shown) having an etch selectivity with respect to the first interlayer insulating layer 60 may be formed on the semiconductor substrate 50. The insulating layer may be conformally formed on an entire surface of the semiconductor substrate 50. Thereafter, an overall etch-back process may be performed on the insulating layer to form the barrier insulating layer 63s. The barrier insulating layer 63s may be formed on sidewalls of the first interlayer insulating layer 60 and upper portions 58a of the sidewalls of the bit line pad 58b. More particularly, e.g., the barrier insulating layer 63s may be continuously formed on sidewalls of the first interlayer insulating layer 60 and upper portions 58a of sidewalls of the bit line pad 58b that form a boundary of the bit line contact hole 62h. The barrier insulating layer 63s may be interposed between the bit line pad 58b and the first interlayer insulating layer 60, and may be connected with the capping insulating layer 44 to overlap, e.g., surround, the upper portions 58a of the sidewalls of the bit line pad 58b.

Figure 5A:
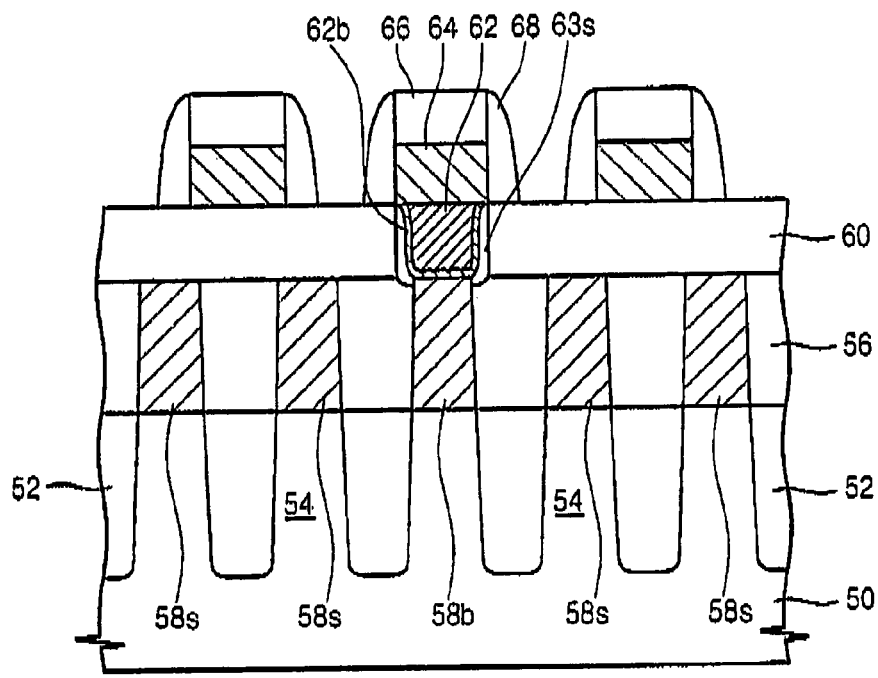
Figure 5B:
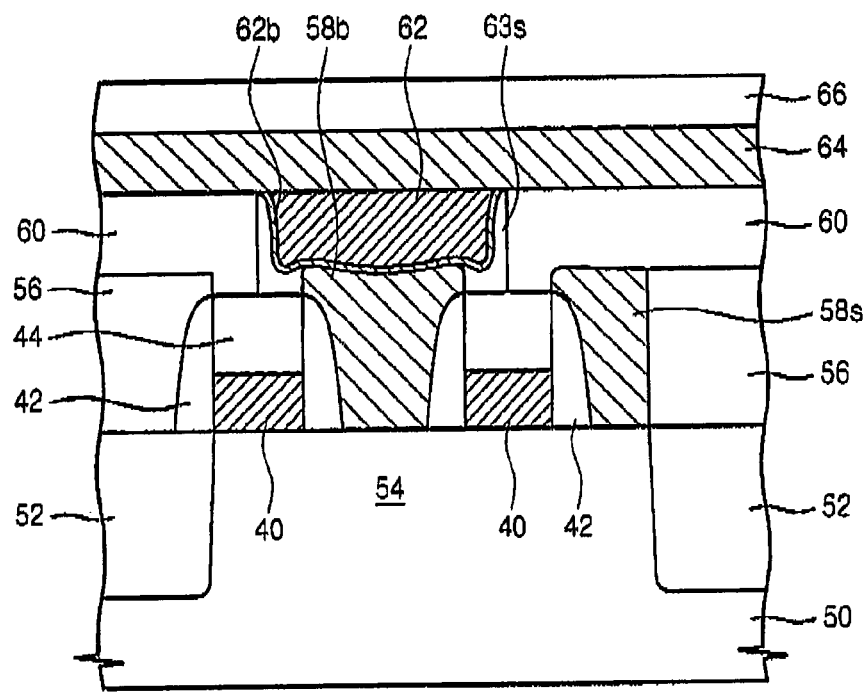

Referring to FIGS. 5A and 5B, the barrier metal layer 62b may be formed in the bit line contact hole 62h where the barrier insulating layer 63s is formed. The barrier metal layer 62b may include metal that can combine with the bit line pad 58b to form an ohmic layer. More particularly, e.g., the barrier metal layer 62b may include a stacked layer of, e.g., titanium and titanium nitride. The barrier metal layer 62b may be formed on a surface of the semiconductor substrate 50. More particularly, e.g., the barrier metal layer 62b may be formed on an entire surface of the semiconductor substrate 50 such that the barrier metal layer 62b is conformally formed in the bit line contact hole 62h.

A bit line layer (not shown) for forming the bit line 64 may be formed on a surface of the semiconductor substrate 50. More particularly, e.g., the bit line layer may include a conductive material, e.g., metal, may be formed on an entire surface of the semiconductor substrate 50 where the barrier metal layer 62b is formed, and may fill the bit line contact hole 62h. The bit line metal layer may be patterned to form the bit line plug 62 and/or the bit line 64 connected with the bit line plug 62. The bit line 64 may extend on the first interlayer insulating layer 60, along a direction crossing, e.g. perpendicular to, a direction along which the word lines 40 extend. In some embodiments of the invention, the bit line plug 62 and the bit line 64 may be simultaneously formed. In other embodiments of the invention, a conductive layer may be formed and patterned to form the bit line 64 after forming the bit line plug 62. That is, e.g., a conductive layer for forming the bit line plug 62 may be formed and then planarized to form the bit line plug 62 filling the bit line contact hole 62h. Then, a conductive layer for forming the bit line 64 may be formed and patterned on a surface, e.g., an entire surface, of the substrate where the bit line plug 62 is formed.

The capping layer 66 may be further formed on the bit line 64. The capping layer 66 may be formed on the conductive layer for forming the bit line and may be patterned together with the bit line 64.

Next, sidewall insulating layers 68 may be formed on sidewalls of the bit line 64. The sidewall insulating layers 68 enable an SAC process to be employed to form storage contact holes. The capping layer 66 and the sidewall insulating layers 68 may be formed of a material having an etch selectivity with respect to the first interlayer insulating layer 60 and a second interlayer insulating layer (not shown) to be formed later, e.g., a silicon nitride layer.

Figure 6A:
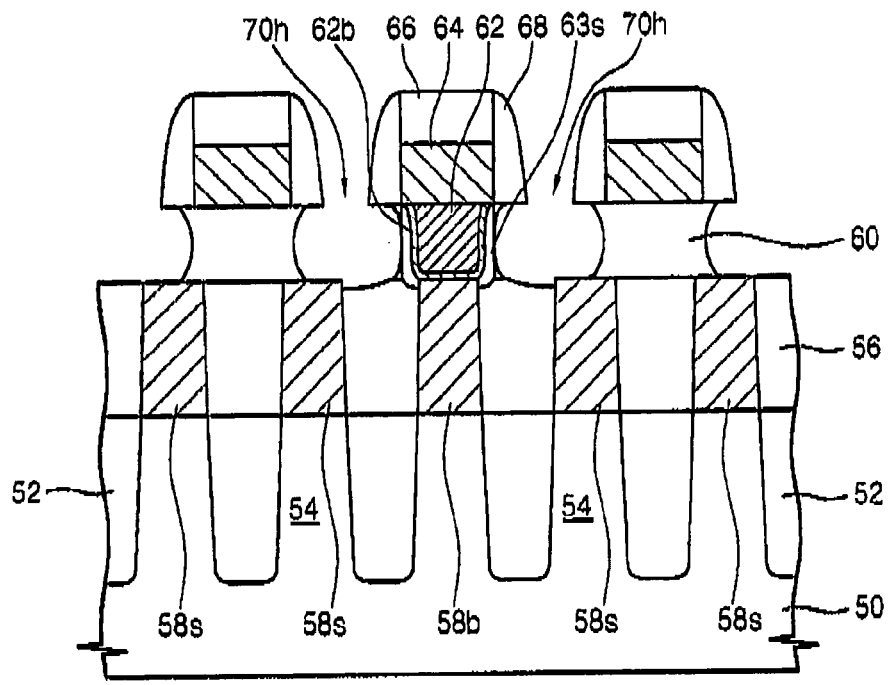
Figure 6B:
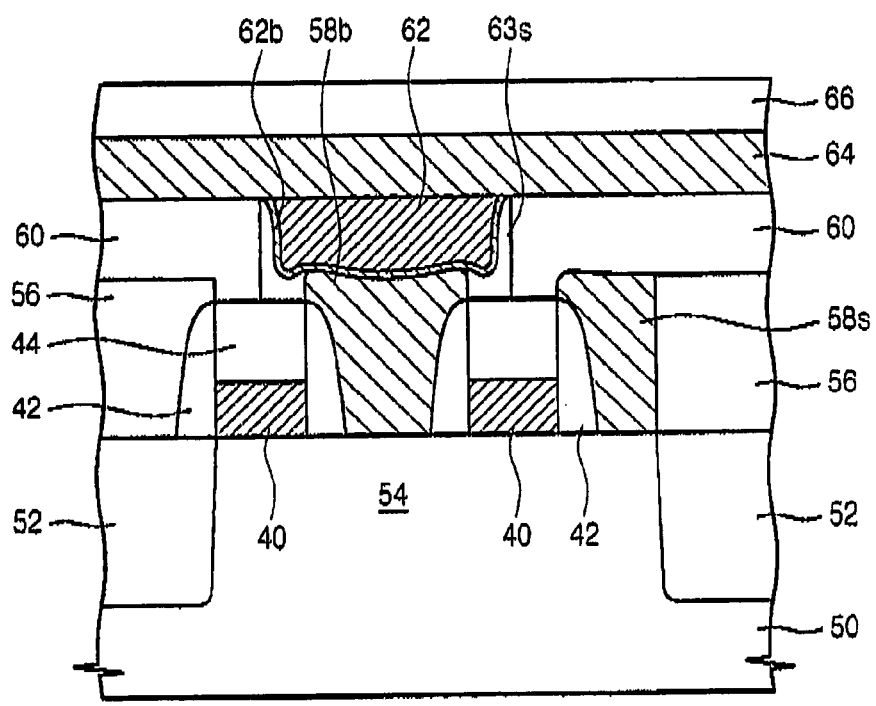

Referring to FIGS. 6A and 6B, a second interlayer insulating layer (not shown) may be formed on a surface, e.g., an entire surface, of the first interlayer insulating layer 60 where the bit line 64 is formed. The second interlayer insulating layer may be formed of the same material as the first interlayer insulating layer 60, or an insulating layer having a lower isotropic etching rate than that of the first interlayer insulating layer 60. However, the first interlayer insulating layer 60 and the second interlayer insulating layer may be formed of a material having a relativley high etching rate in a specific etching solution, compared to the capping layer 66, the sidewall insulating layers 68, and the barrier insulating layer 63s.

Next, the first interlayer insulating layer 60 and second interlayer insulating layer may be patterned to form storage contact holes 70h exposing the storage pads 58s. The storage contact holes 70h may be formed using, e.g., an isotropic etching process for the first interlayer insulating layer 60 and second interlayer insulating layer. For example, the first interlayer insulating layer 60 and the second interlayer insulating layer may be anisotropically etched to partially expose the storage pads 58s, and then may be isotropically etched to laterally extend the storage contact holes 70h to increase an exposed area of the storage pads 58.

Embodiments of the invention may provide the barrier insulating layer 63s that overlaps, e.g., surrounds, upper portions 58a of sidewalls of the bit line pad 58b, and thus may reduce and/or prevent etching solution from permeating into the bit line pad 58b. Embodiments of the invention may separately provide the barrier insulating layer 63s that may function as an etch stop layer in an isotropic etching process, and thus a boundary of storage contact holes 70h may be confined by the barrier insulating layer 63s. The boundary of the storage contact holes 70h may also be confined by a capping layer and/or sidewall insulating layers.

Next, a conductive layer may fill in the storage contact holes 70h to form storage plugs 70. Then, as illustrated in FIGS. 1A and 1B, an upper interlayer insulating layer 72 and storage electrodes 74 may be formed.

As described above, according to one or more aspects of the present invention, when an isotropic etching process is performed to increase a width of the storage contact hole, e.g., increase a width of a lower portion of the storage contact hole below spacer insulating patterns, permeation of an etching solution into a bit line pad may be reduced and/or prevented. Therefore, an increase in a contact resistance between the bit line pad and the bit line plug can be suppressed.

In addition, according to one or more aspects of the invention, the barrier insulating layer can prevent and/or reduce the boundary of the storage contact hole from extending to the bit line pad, and may thereby avoid and/or reduce an occurrence of a short circuit between the storage plug and the bit line pad.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
    a semiconductor substrate;
    a storage pad and a bit line pad on the semiconductor substrate;
    a first interlayer insulating layer covering the bit line pad and including a bit line contact hole having a width greater than a width of the bit line pad;
    a bit line plug in the bit line contact hole;
    a barrier insulating layer on sidewalls of the first interlayer insulating layer, upper portions of sidewalls of the bit line pad that are exposed by the bit line contact hole, and sidewalls of the bit line plug; and
    a storage plug penetrating the first interlayer insulating layer and contacting the storage pad, wherein the bit line plug is on the barrier insulating layer.

2. The semiconductor device as claimed in claim 1, wherein the barrier insulating layer continuously extends on the sidewalls of the first interlayer insulating layer and the upper portions of sidewalls of the bit line pad.

3. The semiconductor device as claimed in claim 1, further comprising a barrier metal layer continuously interposed between the bit line plug and the barrier insulating layer, and the bit line plug and the bit line pad.

4. The semiconductor device as claimed in claim 1, further comprising:
    a bit line on the first interlayer insulating layer, the bit line being connected with the bit line plug;
    a sidewall insulating layer formed on sidewalls of the bit line; and
    a storage contact hole filled with the storage plug on the storage pad,
    wherein a boundary of the storage contact hole is at least partially defined by the sidewall insulating layer and the barrier insulating layer.

5. The semiconductor device as claimed in claim 4, wherein the barrier insulating layer includes a material having an etch selectivity with respect to the first interlayer insulating layer.

6. The semiconductor device as claimed in claim 4, wherein the storage contact hole extends below at least a portion of the sidewall insulating layer.

7. The semiconductor device as claimed in claim 1, wherein the barrier insulating layer includes a material having an etch selectivity with respect to the first interlayer insulating layer.

8. The semiconductor device as claimed in claim 1, wherein the barrier insulating layer is continuously interposed between the storage plug and the bit line plug, thereby preventing contact between the storage plug and the bit line plug.

9. The semiconductor device as claimed in claim 1, further comprising:
    an active region defined in the semiconductor substrate;
    a plurality of word lines overlapping the active region;
    spacer patterns formed on sidewalls of the word lines; and
    a capping insulating layer formed on each of the word lines,
    wherein the storage pad and the bit line pad are self-aligned with the spacer patterns and are on the active region.

10. The semiconductor device as claimed in claim 9, wherein:
    the first interlayer insulating layer defines a boundary of the bit line contact hole on the capping insulating layer, and
    the barrier insulating layer is continuously formed in the bit line contact hole on sidewalls of the first interlayer insulating layer, an upper surface of the capping insulating layer, and upper portions of sidewalls of the bit line pad.

11. The semiconductor device as claimed in claim 9, further comprising a barrier metal layer continuously interposed between the bit line plug and the barrier insulating layer, and the bit line plug and the bit line pad.

12. The semiconductor device as claimed in claim 9, further comprising:
    a bit line connected with the bit line plug and extending in a direction on the first interlayer insulating layer;
    sidewall insulating layers formed in sidewalls of the bit line; and
    a storage contact hole filled with the storage plug on the storage pad,
    wherein a boundary of the storage contact hole is defined by the sidewall insulating layers and the barrier insulating layer.

13. The semiconductor device as claimed in claim 12, wherein the barrier insulating layer includes a material having an etch selectivity with respect to the first interlayer insulating layer.

14. The semiconductor device as claimed in claim 9, wherein the barrier insulating layer is continuously interposed between the storage plug and the bit line plug, thereby preventing contact between the storage plug and the bit line plug.

15. The semiconductor device as claimed in claim 1, wherein the barrier insulating layer extends along substantially the entirety of the sidewall of the bit line plug.

16. The semiconductor device as claimed in claim 1, wherein the bit line plug is conformal with the barrier insulating layer.

17. The semiconductor device as claimed in claim 16, wherein a barrier metal layer is between the bit line plug and the barrier insulating layer.

* * * * *